(12) United States Patent
Suzuki et al.

(10) Patent No.: US 6,548,426 B1
(45) Date of Patent: Apr. 15, 2003

(54) METHOD FOR IMPROVING A QUALITY OF DIELECTRIC LAYER AND SEMICONDUCTOR DEVICE

(75) Inventors: Setsu Suzuki, Tokyo (JP); Kazuo Maeda, Tokyo (JP)

(73) Assignees: Canon Sales Co., Ltd., Tokyo (JP); Semiconductor Process Laboratory Co., Ltd., Tokyo (JP)

(*) Notice: Subject to any disclaimer, the term of this patent is extended or adjusted under 35 U.S.C. 154(b) by 58 days.

(21) Appl. No.: 09/625,355

(22) Filed: Jul. 25, 2000

(30) Foreign Application Priority Data

Sep. 1, 1999 (JP) ............................................. 11-247727

(51) Int. Cl.$^7$ ............................................... H02L 21/31
(52) U.S. Cl. ....................................................... 438/787
(58) Field of Search ................................. 438/758, 770, 438/773, 774, 787

(56) References Cited

U.S. PATENT DOCUMENTS

| 5,492,858 A | 2/1996 | Bose et al. | ................... | 437/67 |
| 5,525,550 A | 6/1996 | Kato | ................... | 437/238 |
| 5,679,475 A | * 10/1997 | Yamagata et al. | ................... | 428/304.4 |
| 6,066,508 A | * 5/2000 | Tanabe et al. | ................... | 423/248 |

FOREIGN PATENT DOCUMENTS

| JP | 3-505145 | 7/1991 |
| JP | 4-372131 | 12/1992 |
| JP | 05304147 A | 11/1993 |
| JP | 6-151416 | 5/1994 |
| JP | 6-163522 | 6/1994 |
| JP | 10-284484 | 10/1998 |
| JP | 11-233508 | 8/1999 |
| KR | 97-52909 | 12/1995 |
| WO | 89/11731 | 11/1989 |

OTHER PUBLICATIONS

Sano et al, IEEE Electron Device Letters, IEEE Inc., vol. 16, No. 5, May 1, 1995, pp. 157–160.
IBM Technical Disclosure Bulletin, vol. 23, No. 5, Oct. 1, 1980.

* cited by examiner

*Primary Examiner*—Kamand Cuneo
*Assistant Examiner*—Lisa Kilday (57) ABSTRACT

There is provided a method for improving film quality of an insulating film, which includes the steps of forming a silicon oxide film on a substrate, and heating the silicon oxide film by contacting an exposed surface of the silicon oxide film with a steam-containing atmosphere after the silicon oxide film is formed.

7 Claims, 7 Drawing Sheets

METHOD FOR IMPROVING A QUALITY OF DIELECTRIC LAYER AND SEMICONDUCTOR DEVICE

BACKGROUND OF THE INVENTION

The present invention relates to a method of improving film quality of an insulating film and, more particularly, to a method of improving film quality of an $SiO_2$ film, densifying the $SiO_2$ film by reducing impurities such as hydrocarbon, etc., which are contained in the $SiO_2$ film (insulating film) formed by the CVD (Chemical Vapor Deposition) method using a reaction gas containing TEOS (Tetraethoxysilane), and to a semiconductor device including an insulating film of the thus improved quality.

In the prior art, after an insulating film such as a $SiO_2$ film, etc. is formed on a substrate, e.g., a silicon wafer, a heat treatment called annealing is applied to the insulating film. This heat treatment is for the purpose of improving the film quality of the insulating film and is performed by exposing the surface of the insulating film to a high temperature atmosphere containing an inert gas such as $N_2$, etc.

SUMMARY OF THE INVENTION

It is an object of the present invention to provide a novel film quality improving method for an insulating film that is different from the heat treatment using $N_2$ (nitrogen), and to provide a semiconductor device including an insulating film of the thus improved quality.

In the method for improving film quality of an insulating film according to the present invention, the heat treatment is performed by exposing the surface of the $SiO_2$ film (insulating film), which is formed by the CVD (Chemical Vapor Deposition) method using a reaction gas containing TEOS (Tetraethoxysilane), to an atmosphere containing steam. According to this method, steam or OH group dissociated from the steam enters into the interior of the $SiO_2$ film, whereby impurities such as hydrocarbon, etc., contained in the film are oxidized, desorbed and expelled from the film. At the same time, dangling bonds of Si (silicon) atoms contained in the film are replaced with $SiO_2$ bonds by the strong oxidizing power of the steam-containing atmosphere.

It has now been found that, if the heat treatment is performed in such a manner, a $SiO_2$ film whose film quality is close to that of a thermal oxide film can be obtained at a lower temperature than that of the heat treatment in a $N_2$ (nitrogen) atmosphere. The reason for this may be that the desorption of the above-mentioned impurities and replacement of dangling bonds of the Si (silicon) atoms with the $SiO_2$ bonds can be achieved at the relatively lower temperature. Therefore, since the heat treatment is performed at a lower temperature as compared with heat treatment in a $N_2$ (nitrogen) atmosphere, failure due to the heat treatment in the high temperature atmosphere is avoided.

It has also been found that the effect of the film quality improvement reaches not only an upper layer portion of the $SiO_2$ film but also to almost 1.0 μm in depth from a surface of the film. Therefore, the film quality improvement of the $SiO_2$ film that is formed in a deep trench, for example, can also be attained.

Further, it has been found that change in the film thickness after the heat treatment is smaller than the heat treatment in a $N_2$ (nitrogen) atmosphere. The reason for this may be that new $SiO_2$ is formed on the side wall portions and the bottom portions of the deep trenches of the film by thermally oxidizing Si (silicon) layers and thus shrinkage of the film can be suppressed by the amount of such newly formed $SiO_2$. Therefore, device failure due to the shrinkage of the film can be prevented.

DETAILED DESCRIPTION OF THE PREFERRED EMBODIMENT

An embodiment of the present invention will hereinafter be explained in detail with reference to the accompanying drawings.

(1) Explanation of the Film Quality Improving Method for an Insulating Film According to One Embodiment of the Present Invention FIGS. 1A to 1G are sectional views showing the steps in a method of improving film quality of an insulating film according to the present embodiment.

The film quality improving method for the insulating film according to the present invention will be explained with reference to the burying of a STI (Shallow Trench Isolation) structure for device isolation, as an example.

Figure 1A:
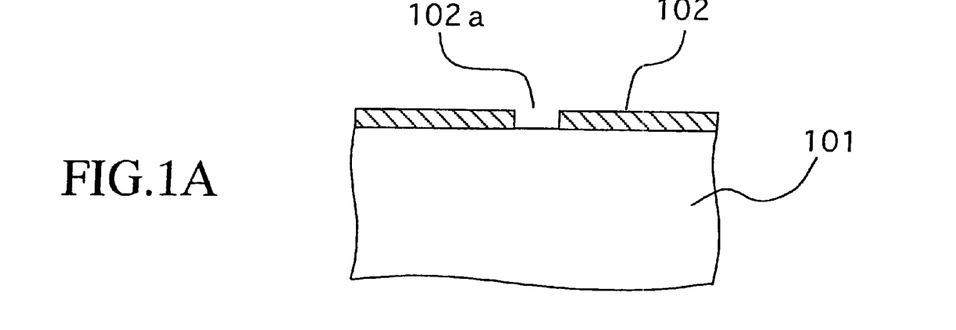
FIGS. 1A to 1G are sectional views showing the various steps in a film quality improving method for an insulating film according to an embodiment of the present invention.

First, as shown in FIG. 1A, a SiN film 102 having an opening 102a is formed on a surface of a wafer (silicon single crystal) 101 as a substrate.

Figure 1B:
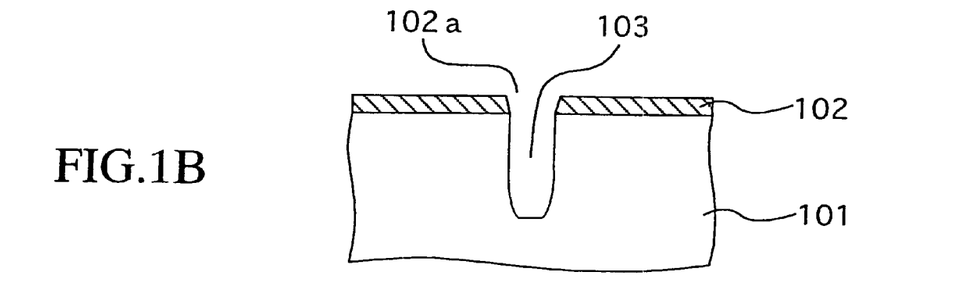

Then, as shown in FIG. 1B, dry etching is performed using the SiN film 102 as a mask. Accordingly, the wafer (silicon single crystal) 101 located directly under the opening 102a is selectively etched, whereby a trench 103 is formed.

Figure 1C:
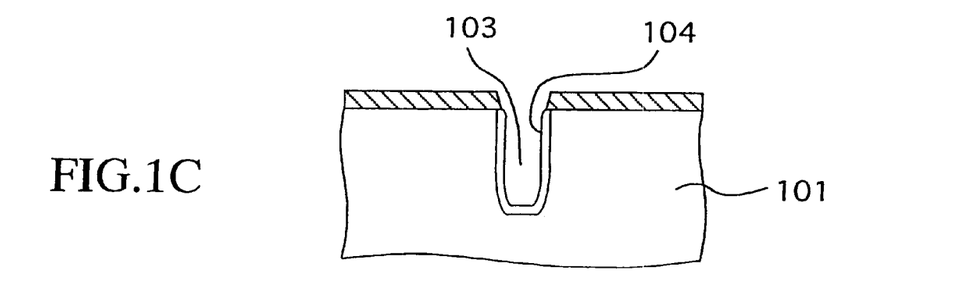

In turn, as shown in FIG. 1C, a thermal oxide film 104 is formed in the trench 103 by exposing the wafer (silicon single crystal) 101 to a high temperature oxygen atmosphere.

Figure 1D:
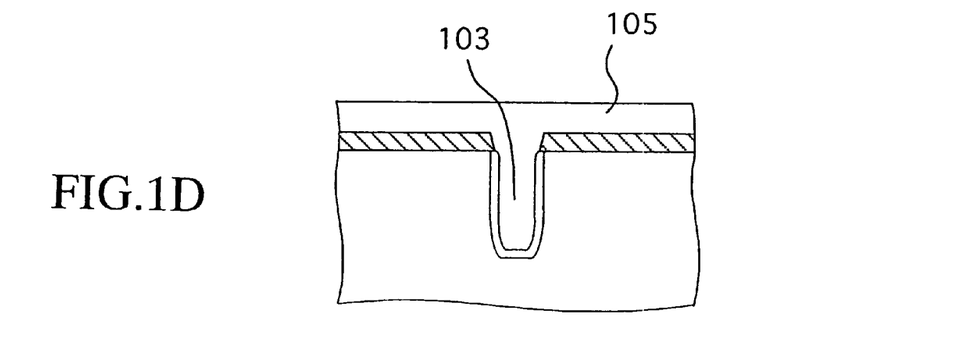

Then, as shown in FIG. 1D, an $SiO_2$ film (insulating film) 105 is formed over the entire surface. This $SiO_2$ film 105 is formed by the atmospheric pressure CVD (atmospheric pressure Chemical Vapor Deposition) method using TEOS and a high concentration of $O_3$ in a reaction gas. It has been known that, if $O_3$ is added to the reaction gas at a relatively high concentration, the formed $SiO_2$ film 105 exhibits surface flow (also referred to as a "flow characteristic" hereinafter).

It is considered that this flow characteristic results from a great number of polymers of TEOS molecules (also referred to as "TEOS oligomers" hereinafter) formed during film formation on the substrate, which TEOS oligomers flow on the surface of the silicon wafer.

Then, because of the flow characteristic, the trenches 103 are completely filled with the $SiO_2$ film 105 without leaving any unfilled spaces. Film forming conditions for the $SiO_2$ film 105 are listed on Table 1.

TABLE 1

| Items | Condition Values |
|---|---|
| Wafer temperature | 415° C. |
| $O_2$ flow rate | 7.5 slm |
| $N_2$ flow rate | 18.0 slm |
| TEOS/$N_2$ flow rate | 7.5 slm |
| $O_3$ concentration | 130 g/Nm$^3$ |
| Deposited film thickness | 1.2 μm |

In the present embodiment, TEOS is supplied to a chamber (not shown) by means of $N_2$ bubbling. The "TEOS/$N_2$ flow rate" on the fifth line of Table 1 is defined as the flow rate of $N_2$ used in this bubbling. The "N" in the unit "g/Nm$^3$" on the sixth line of Table 1 is an abbreviation for "Normal (standard state)", and this unit "g/Nm$^3$" is defined as a density in the standard S state (0° C., 1 atmospheric pressure).

Also, instead of using the atmospheric pressure CVD method, which employs reaction gas containing TEOS and high concentration $O_3$, if a subatmospheric pressure CVD method or a low pressure CVD method, employing the same reaction gas, is used to form the $SiO_2$ film 105, results similar to the following are obtained.

As described above, impurities such as hydrocarbon, etc. are contained in the $SiO_2$ film 105 formed by the CVD method using the reaction gas containing TEOS. Such impurities exert a bad influence upon the characteristics of the semiconductor device. Therefore, the impurities such as hydrocarbon, etc., in the $SiO_2$ film 105 must be reduced to improve the film quality.

Figure 1E:
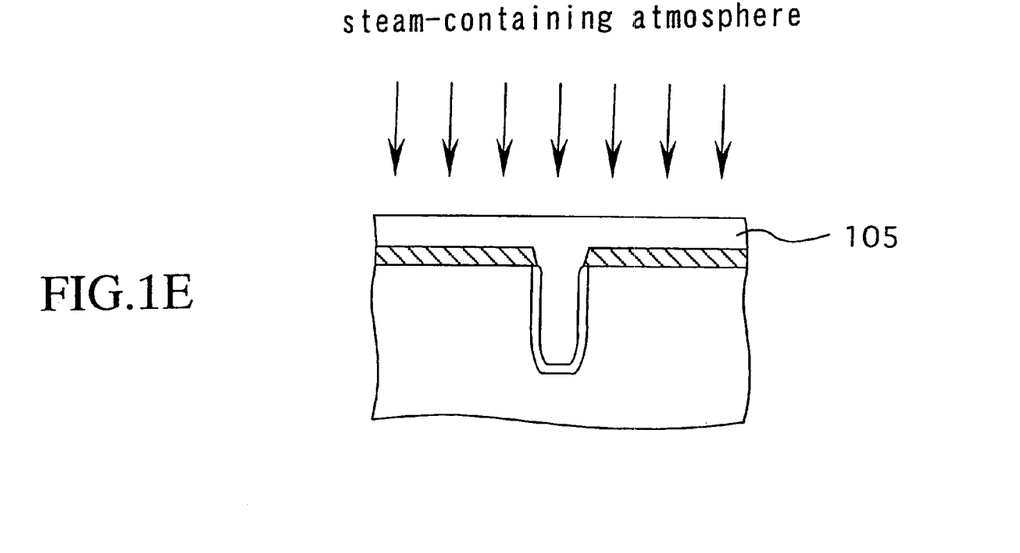

To accomplish this, as shown in FIG. 1E, a heat treatment is performed on the $SiO_2$ film 105. This heat treatment is carried out by exposing the surface of the $SiO_2$ film 105 to the steam-containing atmosphere.

In the present embodiment, in order to charge the chamber (not shown), in which the heat treatment is performed, with a steam-containing atmosphere, oxygen and hydrogen are supplied to the chamber for reaction with each other (hydrogen burning method). The heat treatment conditions (temperature, oxygen flow rate, and hydrogen flow rate) at this time and the film quality of the $SiO_2$ film 105 after the film quality improvement will be described later. If the steam is supplied to the chamber by bubbling water, in place of the above hydrogen burning method, the results obtained are similar to the following.

Figure 1F:
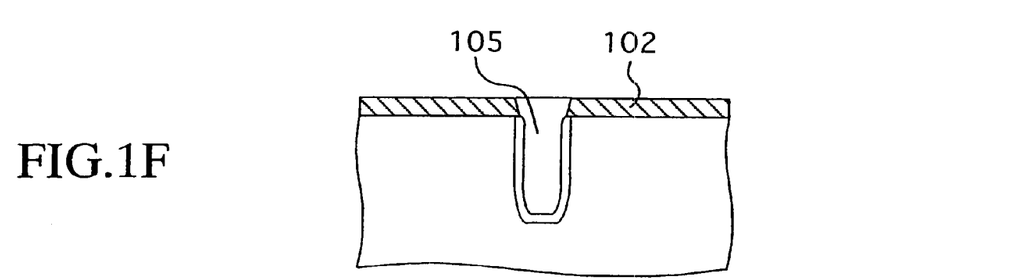

Then, as shown in FIG. 1F, after the heat treatment is finished in this manner, the $SiO_2$ film 105 on the surface of the SiN film 102 is removed by polishing by means of the CMP (Chemical Mechanical Polishing) method.

Figure 1G:
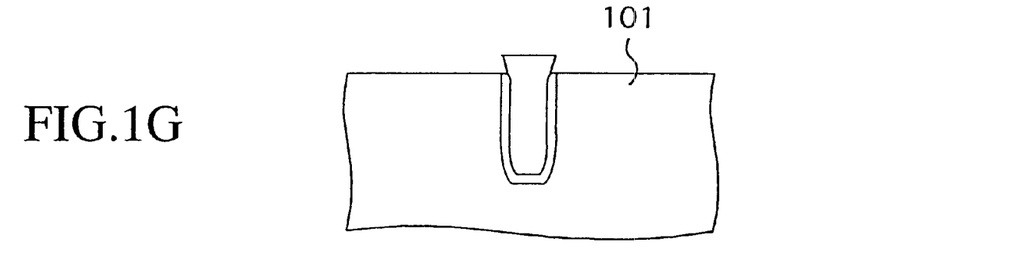

Finally, as shown in FIG. 1G, the SiN film 102 formed on the surface of the wafer (silicon single crystal) 101 is removed, whereby the STI structure burying steps have been completed.

(2) Comparative Example

The film quality of the $SiO_2$ film 105 which has been subjected to the heat treatment performed in the steam containing atmosphere, as shown in FIG. 1E, will be compared with the case where the heat treatment is performed using $N_2$ (nitrogen).

In order to evaluate the film quality of the $SiO_2$ film 105 after the treatment, the following were considered: (I) relationship between the heat treatment temperature and ratio of wet etching rate of the $SiO_2$ film 105 to that of a thermal oxide film, (II) relationship between depth from the surface of the $SiO_2$ film 105 and the ratio of wet etching rate of the $SiO_2$ film 105 to that of a thermal oxide film at this depth, and (III) relationship between the heat treatment temperature of the $SiO_2$ film 105 and change in the film thickness.

(I) Relationship between the heat treatment temperature and the ratio of wet etching rate of the $SiO_2$ film 105 to that of the thermal oxide film.

The ratio of wet etching rate of the $SiO_2$ film 105 to that of the thermal oxide film is defined as: (wet etching rate of the $SiO_2$ film 105)/(wet etching rate of the thermal oxide film). This wet etching rate ratio serves as a criterion in deciding to what extent the film quality of the $SiO_2$ film 105 approaches that of a thermal oxide film.

More particularly, if dangling bonds of the Si—O bond or impurities such as hydrocarbon, etc. are contained in the film, the wet etching rate ratio of the film is increased and therefore the ratio of the wet etching rate to that of the thermal oxide film is increased. In contrast, if only a small amount of dangling bonds or impurities are contained in the film, the wet etching rate of the film comes close to that of the thermal oxide film and therefore the ratio of the wet etching rate to that of the thermal oxide film comes close to 1. Hence, if the ratio of the wet etching rate to that of the thermal oxide film is closer to 1, a smaller amount of dangling bonds and the impurities are contained in the film, and therefore the film quality comes close to that of the thermal oxide film.

By the way, it may be considered that, if the wafer is placed in a high temperature atmosphere, lattice defects are induced in the Si (silicon) crystal due to the stress caused by the bowing of the wafer and thus device failure results. For this reason, it is preferable that the above heat treatment should be performed at as low a temperature as possible.

Figure 2:
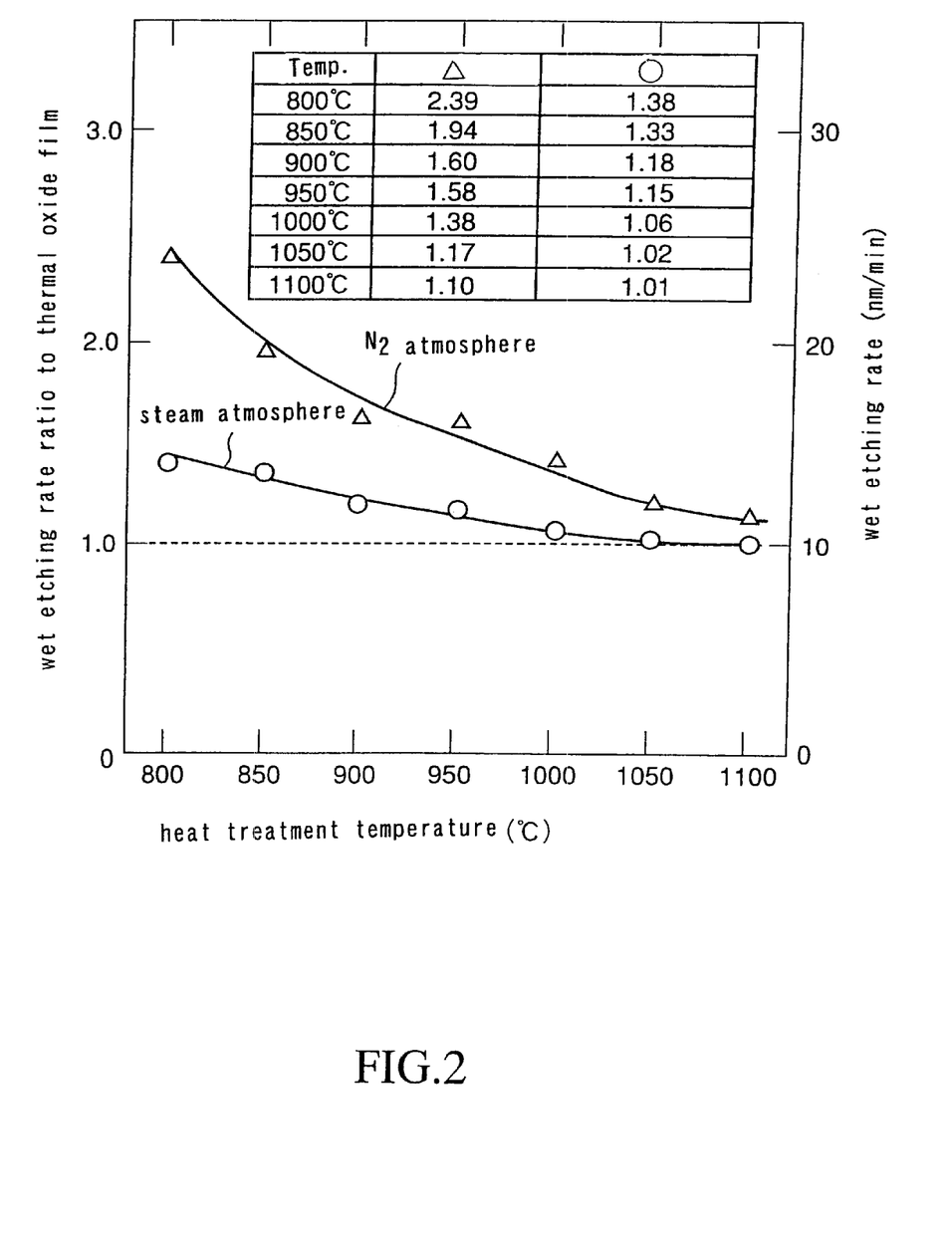
FIG. 2 is a graph showing a relationship between a heat treatment temperature of an $SiO_2$ film, to which the film quality improving method for the insulating film is applied, and a ratio of wet etching rate of the $SiO_2$ film to that of a thermal oxide film.

FIG. 2 is a graph showing the relationship between the heat treatment temperature and the ratio of the wet etching rate of the $SiO_2$ film 105 to that of the thermal oxide film. The film forming conditions of the $SiO_2$ film 105 at this time are given in Table 1. A 2% hydrofluoric acid buffer solution is employed as the etchant. In FIG. 2, the results obtained when the heat treatment is performed in the $N_2$ (nitrogen) atmosphere are also depicted for comparison. The heat treatment conditions at this time are as shown in Table 2. The wet etching rate ratios are measured when the heat treatment temperature is set to 800° C., 850° C., 900° C., 950° C., 1000° C., 1050° C., and 1100° C. respectively.

TABLE 2

| | Conditions | |
|---|---|---|
| Items | $N_2$ atmosphere (Comp. example) | Steam-containing atmosphere (Present invention) |
| $N_2$ flow rate | 10.0 s/m | — |
| $H_2$ flow rate | — | 6.0 slm |
| $O_2$ flow rate | — | 8.0 slm |
| Heat treatment Temperature | 800° C., 850° C., 900° C., 950° C., 1000° C., 1050° C., 1100° C. | |

TABLE 2-continued

| | Conditions | |
|---|---|---|
| Items | $N_2$ atmosphere (Comp. example) | Steam-containing atmosphere (Present invention) |
| Heat treatment Time | | 30 mm |

As is evident from FIG. 2, in the heat treatment performed in the $N_2$ atmosphere, the wet etching rate ratio cannot become smaller than 1.1 after the heat treatment of 1100° C. On the contrary, if the heat treatment is performed in a steam-containing atmosphere as is the present invention, the wet etching rate ratio becomes 1.06, which is smaller than 1.1, after the heat treatment at 1000° C. which is lower than 1100° C.

Accordingly, it can be understood based on the above results that, if the film quality improving method for the insulating film according to the present invention is applied, it is possible to bring the film quality of the $SiO_2$ film 105 closer to that of the thermal oxide film at a lower temperature as compared with that of the case where the heat treatment is performed in the $N_2$ atmosphere.

The reason for this may be that if steam is contained in the heat treatment atmosphere, oxidizing tendency of the atmosphere is increased. Thus, because of the increased oxidizing tendency, impurities such as hydrocarbon, etc. contained in the $SiO_2$ film 105 are oxidized to lower molecular weight $CO_2$. $H_2O$, etc. and then easily desorbed from the film. At the same time, dangling bonds of Si (silicon) atoms existing in the $SiO_2$ film 105 are completely replaced with $SiO_2$ bonds. Since this replacement can be performed at a relatively low temperature, the film quality of the $SiO_2$ film 105 can come much more closer to that of the thermal oxide film at the lower temperature than the case where the heat treatment is carried out in the $N_2$ atmosphere.

In this fashion, if the film quality improving method for the insulating film according to the present invention is applied to the $SiO_2$ film 105, the film quality of the $SiO_2$ film 105 can be made closer to that of the thermal oxide film at a lower temperature than the case where the heat treatment using the $N_2$ (nitrogen) is applied.

(II) Relationship between the depth from the surface of the $SiO_2$ film 105 and the ratio of wet etching rate of the $SiO_2$ film 105 to that of the thermal oxide film at this depth.

Figure 5A:
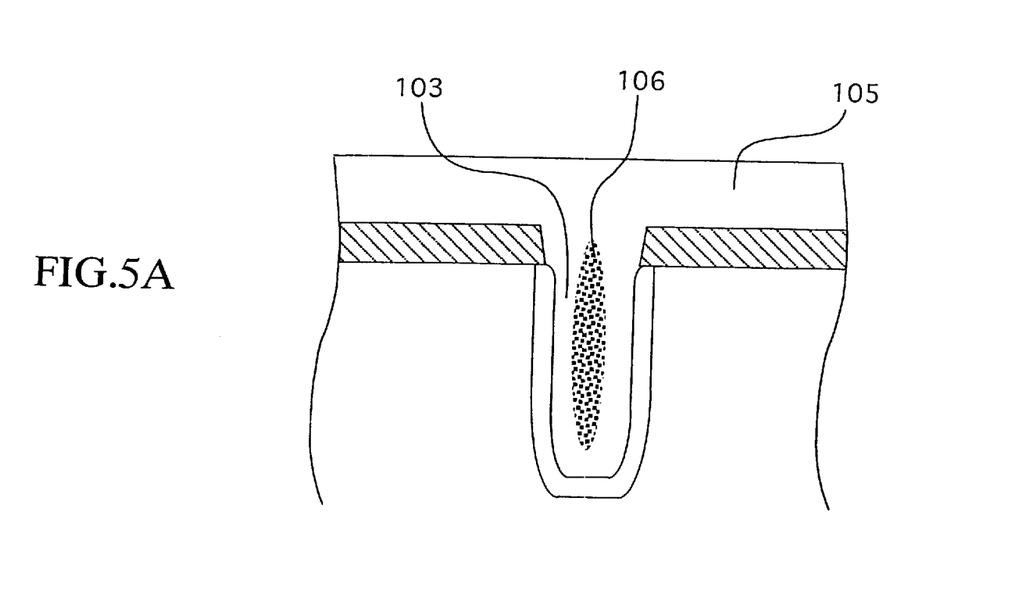
FIGS. 5A, 5B and FIG. 6 are sectional views showing problems in a film quality improving method for an insulating film according to comparative examples.

As shown in FIG. 5A, if the width of the trench 103 is narrow, the impurities 106 such as hydrocarbon, etc., are contained in a considerable amount in the $SiO_2$ film 105 buried in the trench 103 during the step shown in FIG. 1D.

This may be because the burying of the $SiO_2$ film 105 in the trench 103 is completed in such a short time when the width of the trench 103 is narrow that there is no time for the impurities, such as hydrocarbon that are contained in large amounts in the TEOS molecules constituting the oligomer, to desorb from the film.

Therefore, in an attempt to allow such impurities to desorb from the film, the inventors of the present invention have applied a heat treatment to the $SiO_2$ film 105 in a $N_2$ (nitrogen) atmosphere, but found that the impurities contained in the deepest portion of the trench 103 as described above cannot be reduced sufficiently by the heat treatment using $N_2$ (nitrogen). The reason for this may be that, since the $N_2$ (nitrogen) is not oxidative, the impurity 106 cannot be sufficiently expelled from the film by the $N_2$ (nitrogen).

Figure 5B:
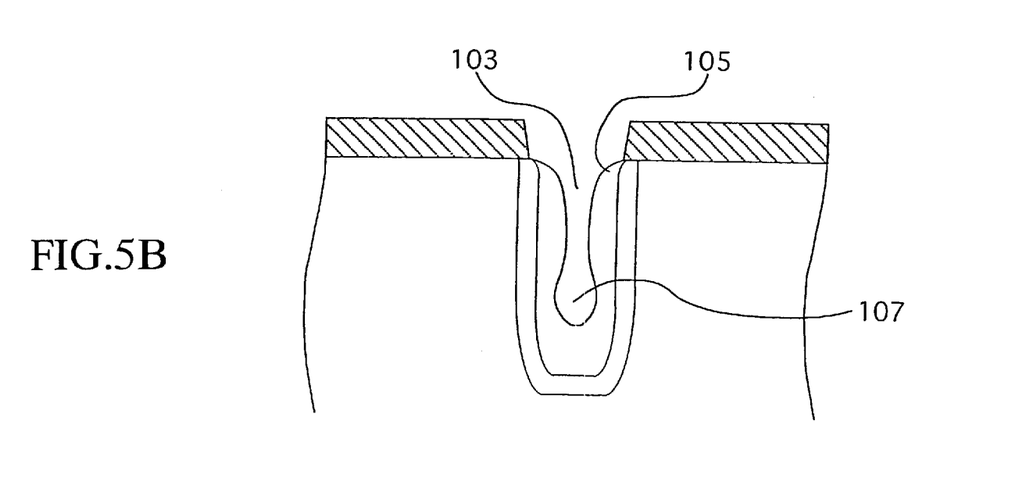

FIG. 5B is a sectional view showing experimental results obtained by the inventors of the present invention which verify that the impurities contained in the deepest portion of the film cannot be sufficiently reduced in the heat treatment using $N_2$ (nitrogen).

FIG. 5B shows the situation where the $SiO_2$ film 105 is exposed to an etchant such as HF (hydrofluoric acid), hydrofluoric acid buffer solution, etc. after the $SiO_2$ film 105 is subjected to the heat treatment using $N_2$. As can be seen from FIG. 5B, a void 107 is formed in the $SiO_2$ film 105 in the trench 103. This is because the etching rate of the $SiO_2$ film 105 where the impurity 106 remains is higher than that of the $SiO_2$ film 105 lacking the impurity 106 and thus a portion of the $SiO_2$ film 105 where the impurity 106 is contained is more apt to be etched.

In order to prevent the above situation, it is preferable that the impurities located, not only in the surface layer of the film, but also in the deep portion of the film, be reduced by the heat treatment of the $SiO_2$ film 105.

Therefore, in order to investigate how deeply the film quality improving effect is attained by the method of the present invention, the inventors of the present invention have examined the relationship between depth from the surface of the $SiO_2$ film 105 and the ratio of wet etching rate of the $SiO_2$ film 105 to that of the thermal oxide film at this depth.

Figure 3:
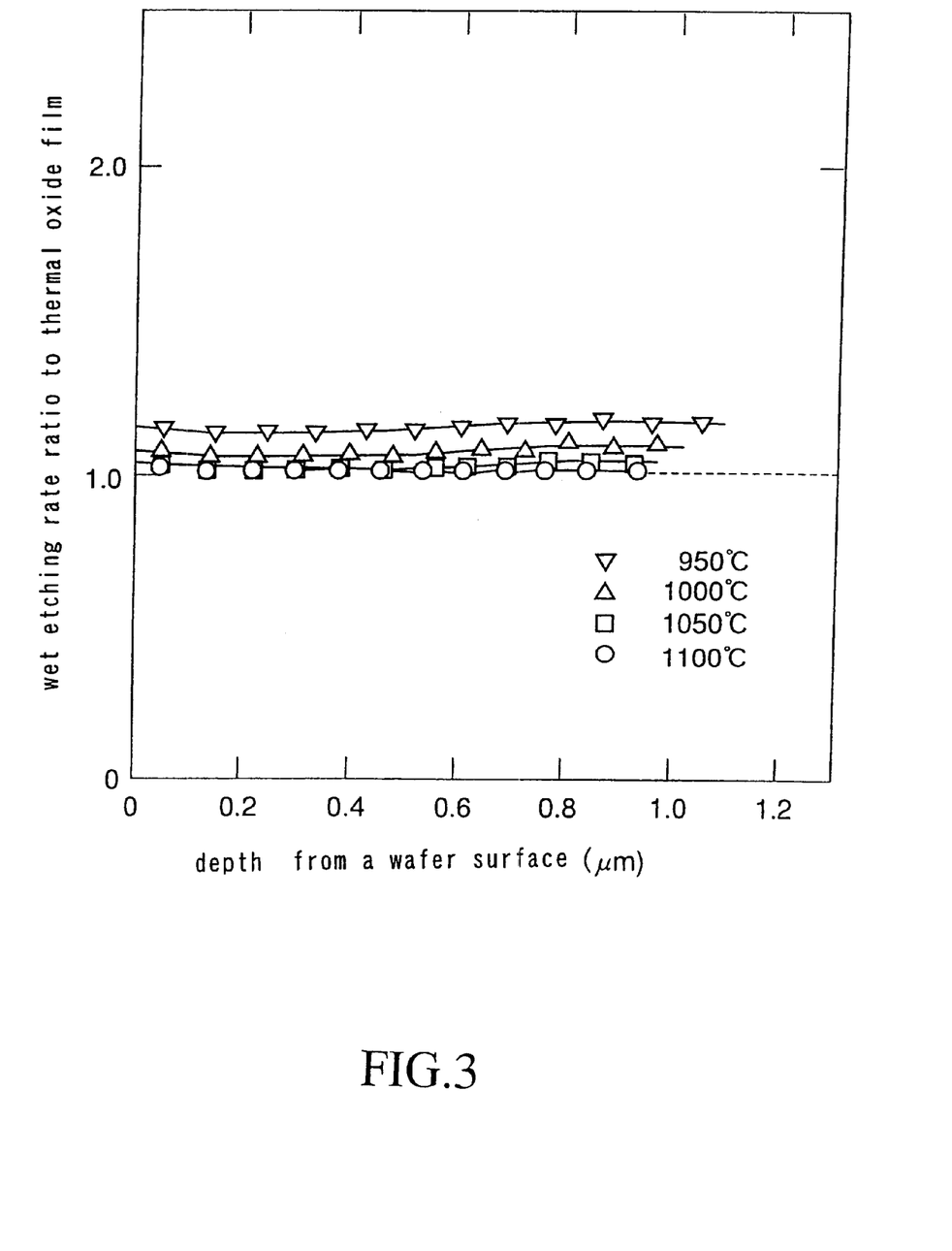
FIG. 3 is a graph showing a relationship between depth from a surface of the $SiO_2$ film, to which the film quality improvement method for the insulating film is applied, and ratio of the wet etching rate of the $SiO_2$ film to that of the thermal oxide film at this depth.

FIG. 3 is a graph showing the relationship between the depth from the surface of the $SiO_2$ film 105 and the ratio of wet etching rate of the $SiO_2$ film 105 to that of the thermal oxide film at this depth.

As is apparent from FIG. 3, the ratio of wet etching rate of the $SiO_2$ film 105 to that of the thermal oxide film is substantially constant in the depth range of 0.0 $\mu$m to 1.0 $\mu$m from the surface of the film. This indicates that the film quality improving effect is attained not only in the surface layer portion of the film, but also attained in the whole of the film uniformly.

Based on the above result, according to the method of the present invention, it can be expected that the film quality in the deeper portion of the $SiO_2$ film 105 can be more greatly improved as compared with the heat treatment using $N_2$ (nitrogen).

(III) Relationship between the heat treatment temperature of the $SiO_2$ film 105 and change in the film thickness.

Normally, there is a possibility that the insulating film such as $SiO_2$ film 105, etc., will thermally shrink in the heat treatment. This is because the insulating film is densified by the heat treatment and thus the film shrinks by an amount corresponding to the increase in the density.

Figure 6:
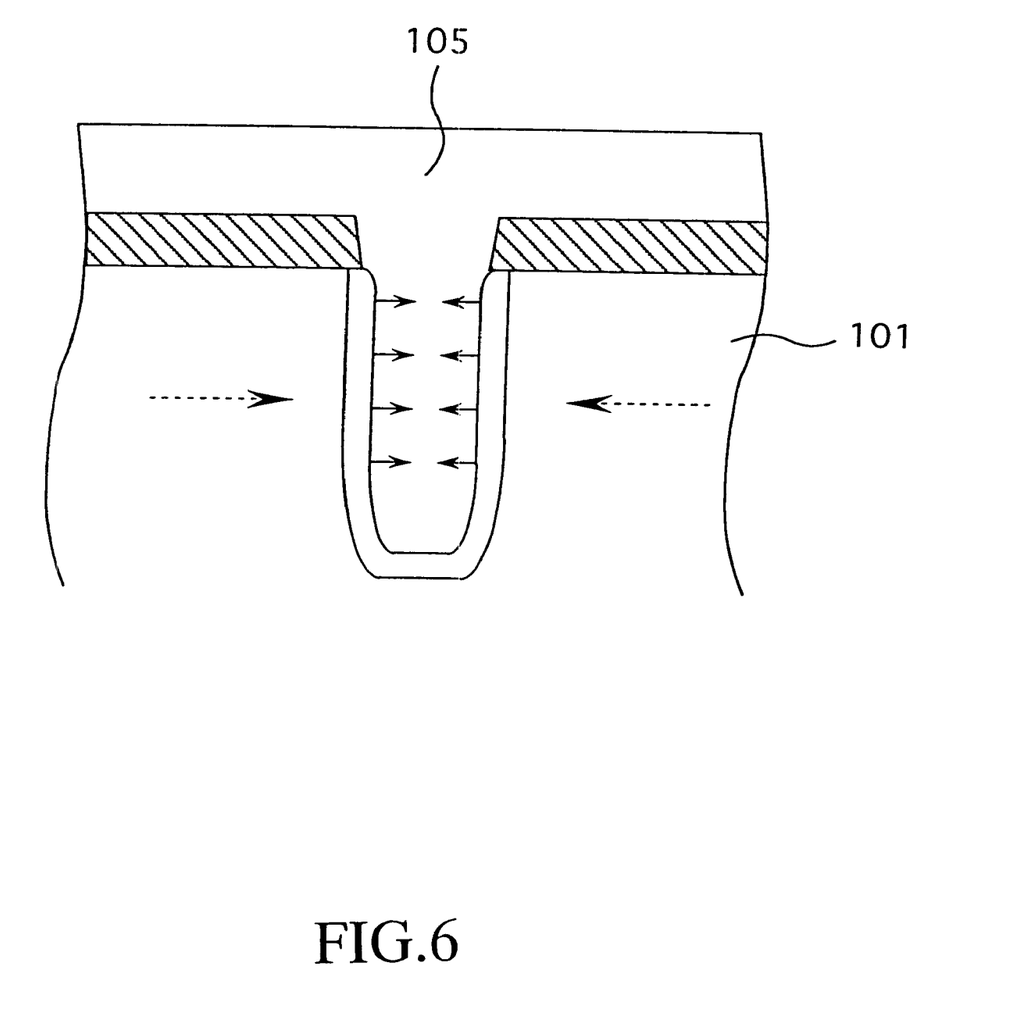

FIG. 6 shows the situation of such shrinkage when employing the heat treatment using $N_2$. In the case of the heat treatment using $N_2$ (nitrogen), the $SiO_2$ film 105 shrinks along the direction indicated by solid line arrows in FIG. 6. Then, tensile stress is applied to the wafer (silicon single crystal) 101 along the direction indicated by broken line arrows in FIG. 6 with the shrinkage of the $SiO_2$ film 105. This tensile stress causes crystal defects in the wafer (silicon single crystal) 101 and thus causes device failure.

For this reason, it is preferable that such thermal shrinkage be suppressed to as small as possible. Hence, the inventors of the present invention have examined how the film thickness of the $SiO_2$ film 105 is changed by the method according to the present invention.

Figure 4:
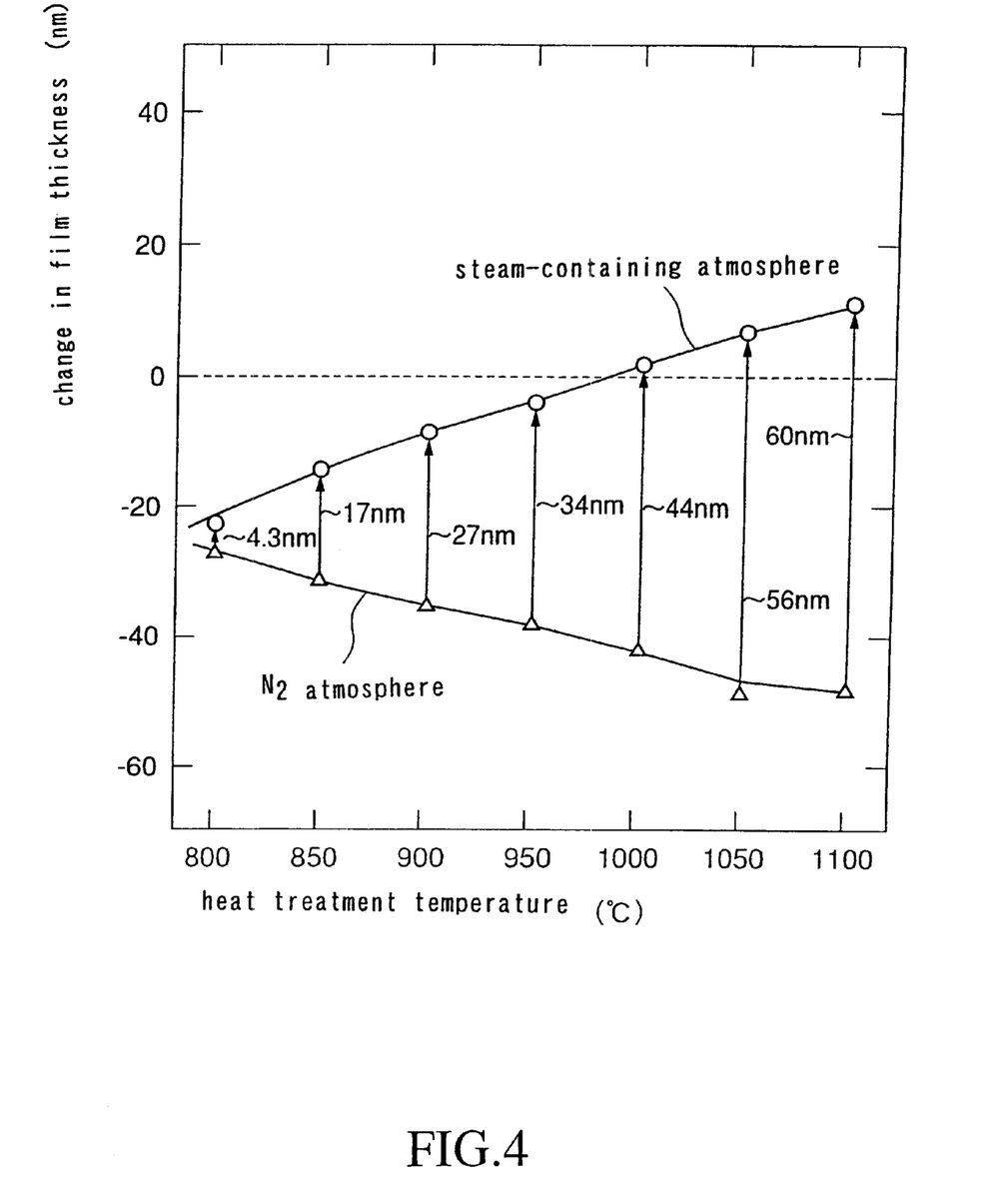
FIG. 4 is a graph showing a relationship between the heat treatment temperature of the $SiO_2$ film, to which the film quality improving method for the insulating film is applied, and change in film thickness.

FIG. 4 is a graph showing a relationship between the heat treatment temperature of the $SiO_2$ film 105 and change in the film thickness. In FIG. 4, the results obtained when the heat treatment is performed in the $N_2$ atmosphere are also depicted for the sake of comparison.

As apparent from FIG. 4, in the heat treatment in the $N_2$ atmosphere, a reduction of the film thickness of about 30 nm to 50 nm occurs. In contrast, in the present invention (the heat treatment in the steam containing atmosphere, a reduction of the film thickness of about 1.5 nm is found at 950° C., and an increase of the film thickness of about 10 nm is found at 1100° C. at which the change in the film thickness is maximum. Hence, it can be understood that, if the film method according to the present invention is applied, the change in the film thickness of the $SiO_2$ film 105 is less than in the case where the heat treatment in the $N_2$ atmosphere is applied.

Also, in the heat treatment in the $N_2$ atmosphere, the change in the film thickness is reduced as the heat treatment temperature is increased. This is because the film is further densified with the increase of the heat treatment temperature and thus the film is shrunken by an amount corresponding to the increase in the density.

On the contrary, in the present invention (the heat treatment in the steam-containing atmosphere), the change in the film thickness is increased with the increase of the heat treatment temperature. The reason for this is that Si (silicon) layers on the side wall portion and the bottom portion of the trench 103 are thermally oxidized by the strong oxidizing tendency of the steam-containing atmosphere to generate new $SiO_2$. Then, since the increase of the film thickness of the $SiO_2$ film 105 due to the newly generated $SiO_2$ is larger than the reduction of the film thickness due to the desorption of the impurities such as hydrocarbon, etc., the overall film thickness of the $SiO_2$ film 105 is increased. In addition, since the amount of the newly generated $SiO_2$ increases as the heat treatment temperature is increased, the change of the film thickness is increased as a function of the heat treatment temperature.

As shown in FIG. 4, if the heat treatment temperature is less than 950° C., the change of the film thickness of the $SiO_2$ film 105, to which the method according to the present invention is applied, is smaller than zero. The reason for this may be that the reduction of the film thickness due to the desorption of the impurities is larger than the increase of the film thickness due to the newly generated $SiO_2$ at this temperature or less.

Also, if the heat treatment temperature is in the neighborhood of 1000° C., the change in the film thickness of the $SiO_2$ film 105 becomes almost zero. The reason for this may be that the reduction of the film thickness due to the desorption of the impurities such as hydrocarbon, etc. and the increase of the film thickness due to the newly generated $SiO_2$ cancel each other and thus the overall film thickness of the $SiO_2$ film 105 is not changed.

Therefore, to reduce device failure due to change in the film thickness effectively, it is preferable that the method of the present invention be performed at a temperature of about 1000° C.

In this manner, in the method according to the present invention, the change in the film thickness of the $SiO_2$ film 105 due to the heat treatment can be reduced as compared with that accompanying the heat treatment in the $N_2$ (nitrogen) atmosphere.

In the embodiment described above the method according to the present invention is applied to a $SiO_2$ film which is formed by the CVD method using TEOS, but the present invention is not so limited. That is, the method according to the present invention can also be applied to a silicon oxide film formed by any film forming method.

Also, the present invention was explained above in connection with burying the STI structure of the semiconductor device as an example. However, the scope of the present invention is not limited to the above. For example, the present invention can also be applied to an interlayer insulating film of a semiconductor device, etc.

In addition, although described above as applied to an insulating film, the present invention may also be applied to a semiconductor device. In such semiconductor device, since the impurities contained in the insulating film are sufficiently reduced, such a problem seldom occurs wherein the characteristics of the device are harmfully affected by the impurities. Further, failure of the semiconductor device caused by the tensile stress of the insulating film due to the heat treatment is unlikely to occur.

As mentioned above, according to the method of the present invention, the following advantages can be achieved by applying the heat treatment in the steam-containing atmosphere to the $SiO_2$ film, which is formed by the CVD method using a reaction gas containing TEOS:

(1) Compared with the case where the heat treatment is performed in a $N_2$ atmosphere, a $SiO_2$ film whose film quality is closer to that of a thermal oxide film can be obtained at a lower temperature.

(2) Compared with the case where the heat treatment is performed in the $N_2$ atmosphere, it can be expected that the improvement in the film quality can be attained in a deeper portion of the film.

(3) Compared with the case where the heat treatment is performed in the $N_2$ atmosphere, the change in the film thickness can be reduced.

Moreover, if the insulating film that is subjected to the method according to the present invention, is applied to a semiconductor device, the number of impurities contained in the insulating film as well as the tensile stress caused by the heat treatment can be satisfactorily reduced. As a result, a semiconductor device in which failure seldom occurs can be provided.

What is claimed is:

1. A method of improving film quality of a silicon oxide insulating film, comprising the steps of:

forming a silicon oxide insulating film containing carbon and hydrogen on a substrate; and heating the silicon oxide film by contacting an exposed surface of the silicon oxide film with a steam-containing atmosphere after the silicon oxide film is formed, so that the carbon and hydrogen are oxidized and removed from the silicon oxide insulating film.

2. The method according to claim 1, wherein the silicon oxide film is formed by a chemical vapor deposition method using a reaction gas containing TEOS (Tetraethoxysilane).

3. The method according to claim 1, wherein the steam is generated by supplying hydrogen and oxygen to the atmosphere.

4. The method according to claim 1, wherein the steam is supplied to the atmosphere by bubbling water.

5. The method according to claim 1, wherein the heating is performed at a temperature in a range of 800° C.–1100° C.

6. The method according to claim 1, wherein the heating is performed at a temperature in a range of 950° C.–1050° C.

7. A method of improving film quality of a silicon oxide insulating film, comprising the steps of:

forming a silicon oxide film containing carbon and hydrogen on a substrate by chemical vapor deposition using a reaction gas containing a silicon-containing organic compound; and heating the silicon oxide film by contacting an exposed surface of the silicon oxide film with a steam-containing atmosphere after the silicon oxide film is formed, so that the carbon and hydrogen contained in the silicon oxide film are oxidized and removed from the silicon oxide film.

* * * * *